(12) United States Patent
Nakamura et al.

(10) Patent No.: US 7,645,658 B2
(45) Date of Patent: Jan. 12, 2010

(54) METHOD OF MANUFACTURING SILICON CARBIDE SEMICONDUCTOR DEVICE

(75) Inventors: Hiroki Nakamura, Handa (JP); Hiroyuki Ichikawa, Toyota (JP); Eiichi Okuno, Mizuho (JP)

(73) Assignee: DENSO CORPORATION, Kariya (JP)

( * ) Notice: Subject to any disclaimer, the term of this patent is extended or adjusted under 35 U.S.C. 154(b) by 241 days.

(21) Appl. No.: 11/976,216

(22) Filed: Oct. 23, 2007

(65) Prior Publication Data

US 2008/0102585 A1 May 1, 2008

(30) Foreign Application Priority Data

Oct. 30, 2006 (JP) .............................. 2006-294158

(51) Int. Cl.
*H01L 21/8238* (2006.01)
(52) U.S. Cl. .................. 438/199; 438/153; 257/E21.63
(58) Field of Classification Search .................. 438/199, 438/197, 153, 154, 163, 164
See application file for complete search history.

(56) References Cited

U.S. PATENT DOCUMENTS

| | | | |
|---|---|---|---|
| 5,731,236 A | 3/1998 | Chou et al. | |
| 5,766,992 A | 6/1998 | Chou et al. | |
| 6,881,632 B2 * | 4/2005 | Fitzgerald et al. | 438/285 |
| 7,176,132 B2 * | 2/2007 | Sashida et al. | 438/677 |
| 2001/0036751 A1 | 11/2001 | Park et al. | |
| 2002/0027241 A1 | 3/2002 | Sung et al. | |
| 2002/0074612 A1 | 6/2002 | Bulucea et al. | |
| 2003/0013266 A1 | 1/2003 | Fukuda et al. | |
| 2005/0179069 A1 | 8/2005 | Wakamiya | |
| 2005/0230686 A1 | 10/2005 | Kojima et al. | |
| 2005/0245034 A1 | 11/2005 | Fukuda et al. | |
| 2007/0045631 A1 | 3/2007 | Endo et al. | |
| 2007/0059911 A1 | 3/2007 | Jawarani et al. | |

FOREIGN PATENT DOCUMENTS

| | | |
|---|---|---|
| JP | A-07-037878 | 2/1995 |
| JP | A-07-037977 | 2/1995 |

OTHER PUBLICATIONS

Office Action dated Jan. 15, 2009 in related U.S. Appl. No. 11/976,217.

(Continued)

*Primary Examiner*—Wai-Sing Louie
*Assistant Examiner*—Nga Doan
(74) *Attorney, Agent, or Firm*—Posz Law Group, PLC

(57) ABSTRACT

A method of manufacturing a silicon carbide semiconductor device having a MOS structure includes preparing a substrate made of silicon carbide, and forming a channel region, a first impurity region, a second impurity region, a gate insulation layer, and a gate electrode to form a semiconductor element on the substrate. In addition, a film is formed on the semiconductor element to provide a material of an interlayer insulation layer, and a reflow process is performed at a temperature about 700° C. or over in an wet atmosphere so that the interlayer insulation layer is formed from the film. Furthermore, a dehydration process is performed at about 700° C. or lower in an inert gas atmosphere after the reflow process is performed.

12 Claims, 11 Drawing Sheets

OTHER PUBLICATIONS

Office Action dated Apr. 16, 2009 in related U.S. Appl. No. 11/976,217.
Office Action dated Jun. 18, 2008 in related U.S. Appl. No. 11/976,217.
Office Action mailed on Jul. 15, 2009 in related U.S. Appl. No. 11/976,217.
U.S. Appl. No. 11/976,217, filed Oct. 23, 2007, Nakamura et al.
Office Action dated Aug. 21, 2009 issued in the corresponding Chinese patent application No. 2007101817927 (English translation enclosed).

* cited by examiner

US 7,645,658 B2

METHOD OF MANUFACTURING SILICON CARBIDE SEMICONDUCTOR DEVICE

CROSS REFERENCE TO RELATED APPLICATIONS

This application is based on Japanese Patent Application No. 2006-294158 filed on Oct. 30, 2006, the content of which is incorporated herein by reference in its entirety. This application is also related to U.S. application Ser. No. 11/976,217, entitled "METHOD OF MANUFACTURING SILICON CARBIDE SEMICONDUCTOR DEVICE", filed on Oct. 23, 2007.

BACKGROUND OF THE INVENTION

1. Field of the Invention

The present invention relates to a method of manufacturing a silicon carbide semiconductor device.

2. Description of the Related Art

US 2003/0013266 A (corresponding to JP 2003-69012 A) discloses a silicon carbide (SiC) semiconductor device, in which a face A having a (11-20) crystal face orientation is used as a channel. The SiC semiconductor device has a MOS (metal-oxide semiconductor) structure, and a channel mobility is improved by hydrogen anneal or being treated in a wet atmosphere that includes both of a hydrogen (H) atom and an oxygen (O) atom. Specifically, the channel mobility is improved by controlling a concentration or a temperature of the hydrogen anneal or the wet atmosphere.

However, further channel mobility is required for the SiC semiconductor device. US 2007/0045631 A (corresponding to JP 2007-96263 A) by the inventors of the present application discloses that a termination/desorption temperature is determined based on the wet atmosphere or a hydrogen atmosphere. The termination/desorption temperature is a temperature at which a dangling bond between SiC and a gate oxide layer is terminated by an element of hydrogen (H) or hydroxyl (OH), i.e., a temperature at which H or OH desorbs. Specifically, the desorption of H or OH mainly occurs at a temperature about in a range between 800° C. and 900° C., and the termination of the dangling bond by H or OH also occurs in the same temperature range. Therefore, the termination/desorption temperature is about in the range between 800° C. and 900° C. Thus, it is required for keeping the wet atmosphere or the hydrogen atmosphere until the temperature decreases at about 800° C. or lower, preferably at about 700° C. or lower, to terminate the dangling bond by H or OH.

When a heating process is performed in the wet atmosphere, an interlayer insulation layer made of BPSG (boron phosphorus silicon glass), for example, absorbs moisture, thereby a material of an electrode disposed on the interlayer insulation layer may be corroded. Thus, it is required to restrict the material of the electrode from being corroded by moisture included in the interlayer insulation layer.

SUMMARY OF THE INVENTION

It is therefore an object of the present invention is to provide a method of manufacturing a SiC semiconductor.

According to an aspect of the invention, a method of manufacturing a SiC semiconductor device having a metal-oxide semiconductor structure includes: a step of preparing a substrate made of SiC; a step of forming a channel region made of SiC on the substrate, in which the channel region provides an electric current passage; a step of forming a first impurity region on the substrate on an upstream side of the electric current passage; a step of forming a second impurity region on the substrate on a downstream side of the electric current passage; a step of forming a gate insulation layer on a surface of the channel region; a step of forming a gate electrode on the gate insulation layer to form a semiconductor element; a step of forming a film on the semiconductor element from a material of an interlayer insulation layer; a step of performing a reflow process at a temperature about 700° C. or over in an wet atmosphere so that the interlayer insulation layer is formed from the film; a step of decreasing the temperature at about 700° C. or lower after performing the reflow process; a step of changing the wet atmosphere to an inert gas atmosphere after the temperature is decreased at about 700° C. or lower; and a step of performing a dehydration process in the inert gas atmosphere so that the interlayer insulation layer is dehydrated. In the SiC semiconductor device, the channel region provides a channel of the semiconductor element, and the channel is controlled by controlling a voltage applied to the gate electrode so that an electric current flowing between the first impurity region and the second impurity region is controlled.

In the above-described method, the dehydration process is performed at about 700° C. or lower in the inert gas atmosphere after the reflow process for forming the interlayer insulation layer is performed in the wet atmosphere. Thereby, moisture included in the interlayer insulation layer is dehydrated and a material of an electrode disposed on the interlayer insulation layer is restricted from being corroded.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
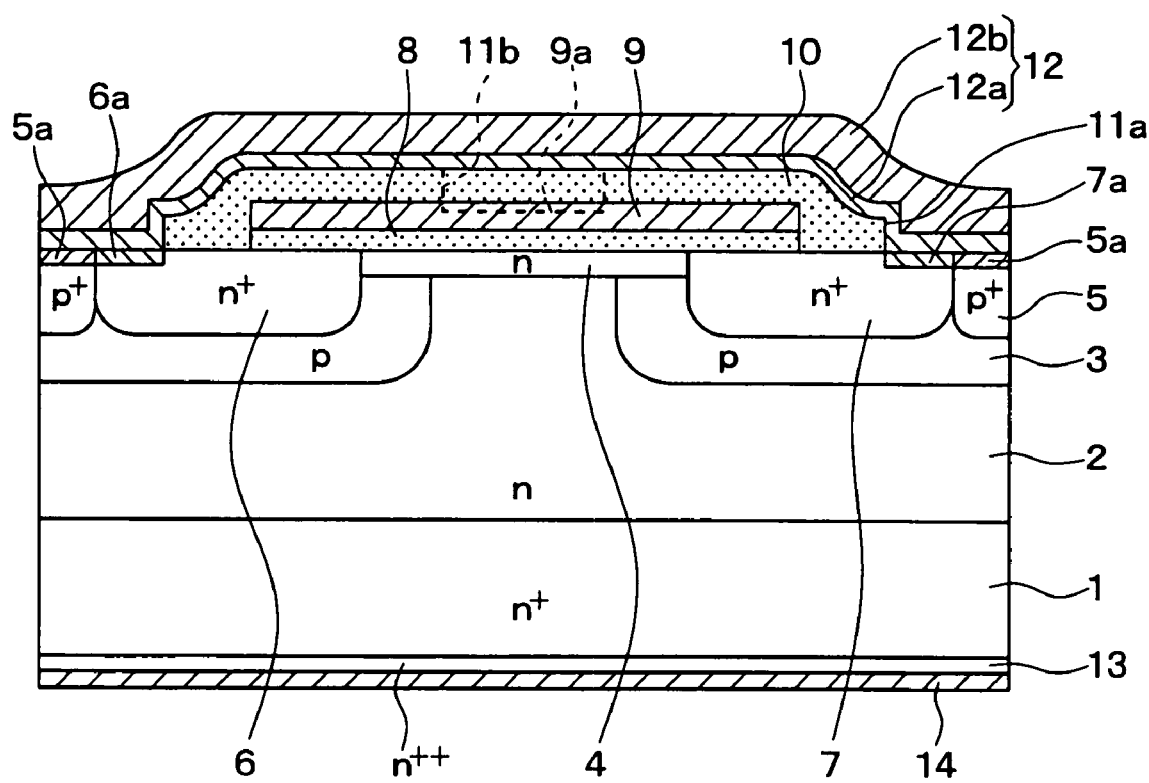
FIG. 1 is a cross-sectional view of a MOSFET according to a first embodiment of the present disclosure.

A SiC semiconductor device having a planer-type MOSFET, for example, will be described with reference to FIG. 1. The MOSFET is formed on an $n^+$-type substrate 1 made of SiC. For example, the substrate 1 is made of 4H—SiC and has an impurity concentration about $5\times10^{18}$ cm$^{-3}$. A main surface of the substrate 1 is a face A having a (11-20) crystal face orientation, for example.

An n-type drift layer 2 is made of SiC and is epitaxially formed on an upper surface of the substrate 1. The n-type drift layer 2 has an impurity concentration about $1\times10^{16}$ cm$^{-3}$ and has a thickness about 10 μm, for example.

At an upper surface portion of the n-type drift layer 2, a plurality of p-type base regions 3 is formed to have a predetermined clearance therebetween. Each of the p-type base regions 3 has an impurity concentration about $1\times10^{19}$ cm$^{-3}$ and has a depth about 0.7 μm, for example.

On an upper surface of the p-type base region 3, an n-type channel layer 4 is epitaxially formed. The n-type channel layer 4 has an impurity concentration about $1\times10^{16}$ cm$^{-3}$ and has a thickness about 0.3 μm, for example.

A plurality of $p^+$-type contact regions 5 are formed to penetrate through the channel layer 4 and reach the p-type base region 3. Each of the contact regions 5 has an impurity concentration about $3\times10^{20}$ cm$^{-3}$ or over and has a depth about 0.4 μm, for example.

On an inside with respect to the contact regions 5, $n^+$-type source regions 6 and 7 are formed so that the channel layer 4 is arranged between the source regions 6 and 7. The $n^+$-type source regions 6 and 7 have a clearance therebetween. In addition, each of the $n^+$-type source regions 6 and 7 has an impurity concentration about $3\times10^{20}$ cm$^{-3}$ or over and has a depth about 0.3 μm, for example.

The channel layer 4 includes channel regions located on the p-type base regions 3. On the channel layer 4, a gate oxide layer 8 is formed at least to cover upper surfaces of the channel regions of the channel layer 4. At an interface between the gate oxide layer 8 and the channel regions of the channel layer 4, a dangling bond is terminated by an element of H or OH.

On an upper surface of the gate oxide layer 8, a gate electrode 9 is pattern-formed. For example, the gate electrode 9 is made of polysilicon in which an n-type impurity (e.g., phosphorus) is doped. An edge portion of the gate electrode 9 is rounded.

An interlayer insulation layer 10 is formed to cover the gate oxide layer 8 and the gate electrode 9. The gate oxide layer 8 and the interlayer insulation layer 10 are provided with a first contact hole 11a reaching the contact regions 5 and the source regions 6 and 7, and a second contact hole 11b reaching the gate electrode 9. The contact regions 5, the source regions 6 and 7, and the gate electrode 9 are electrically coupled with contact parts 5a, 6a, 7a, and 9a, respectively, through the contact holes 11a and 11b. The contact parts 5a, 6a, 7a, and 9a are made of Ni or Ti/Ni, for example. A source electrode 12 is formed on the interlayer insulation layer 10, and includes a base wire electrode part 12a made of Ti and a wire electrode part 12b made of Al. A gate wire (not shown) is also provided.

On a lower surface of the substrate 1, an $n^+$-type drain contact region 13 is formed. An impurity concentration of the drain contact region 13 is higher than the substrate 1. In addition, on a lower surface of the drain contact region 13, a drain electrode 14 is formed. The drain electrode 14 is made of Ni, for example.

The planer-type MOSFET uses the channel layer 4 as an electric current passage, and applies electric current between the $n^+$-type source regions 6 and 7 and the drain contact region 13, which are respectively located on an upstream side and a downstream side of the electric current passage. The electric current flowing between the $n^+$-type source region 6 and 7 and the drain contact region 13 is controlled by controlling a voltage applied to the gate electrode 9, and controlling a width of a depletion layer provided in the channel region to control electric current flowing to the depletion layer.

A manufacturing method of the planer-type MOSFET will now be described with reference to FIGS. 2A-3D. At first, in a process shown in FIG. 2A, the n-type drift layer 2 is epitaxially formed on the upper surface of the $n^+$-type substrate 1 so that the drift layer 2 has the impurity concentration about $1\times10^{16}$ cm$^{-3}$ and has the thickness about 10 μm, for example.

Figure 2A:
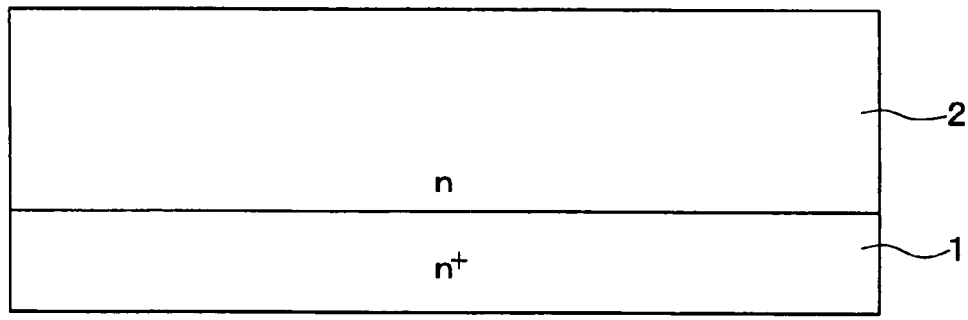
FIGS. 2A-2D are cross-sectional views showing manufacturing processes of the MOSFET according to the first embodiment.
Figure 2B:
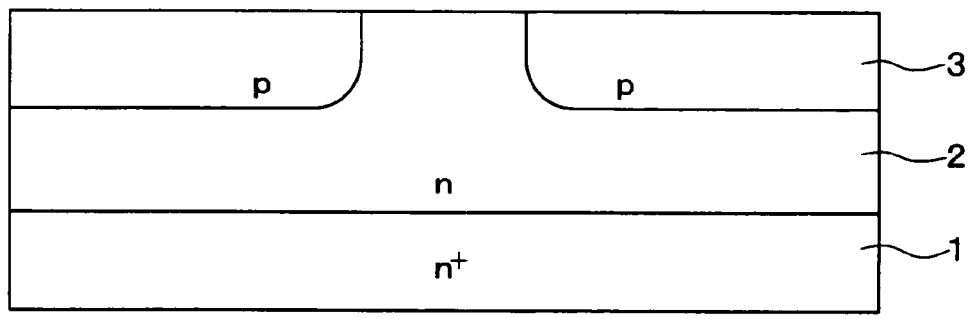

In a process shown in FIG. 2B, a mask, which is made of a LTO (low temperature oxide), for example, is formed on the drift layer 2. The mask is patterned by photolithography so that portions of the mask, under which the p-type base regions 3 will be formed, are opened. Then, a p-type impurity (e.g., Al) is ion-implanted to the upper surface portions of the n-type drift layer 2 from above the mask. After the mask is removed, an activation anneal is performed at about 1600° C. for 30 minutes, thereby the p-type base regions 3 are formed. Each of the p-type base regions 3 has the impurity concentration about $1\times10^{19}$ cm$^{-3}$ and has the depth about 0.7 μm, for example.

Figure 2C:
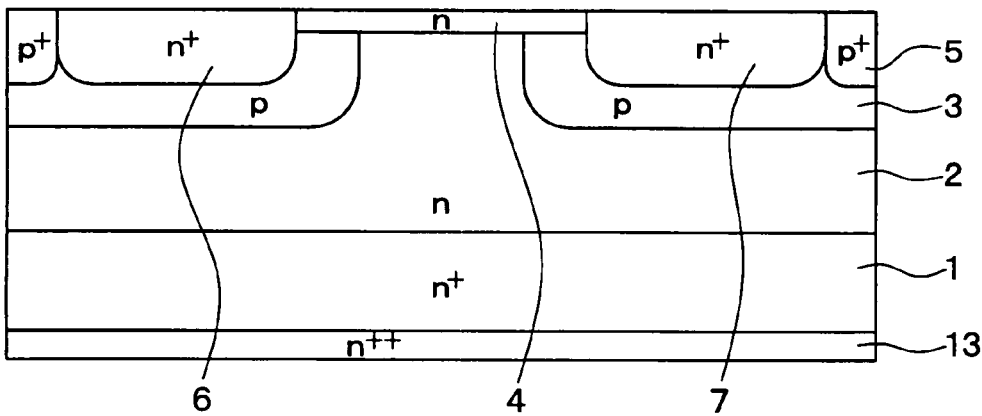

In a process shown by FIG. 2C, the channel layer 4 is epitaxially formed on the p-type base regions 3. For example, the channel layer 4 has the impurity concentration about $1\times10^{16}$ cm$^{-3}$ and has the thickness about 0.3 μm. Then, a first mask made of the LTO is formed on the channel layer 4. The first mask is patterned by photolithography so that portions of the first mask, under which the contact regions 5 will be formed, are opened. Then, a p-type impurity (e.g., Al) is ion-implanted from above the first mask. After the first mask is removed, a second mask made of the LTO is formed on an upper surface of the substrate, and n-type impurity (e.g., phosphorus) is ion-implanted from the lower surface of the substrate 1. Furthermore, after the second mask is removed, a third mask made of the LTO is formed on the upper surface of the substrate. The third mask is patterned by photolithography and portions of the third mask, under which the source regions 6 and 7 will be formed, are opened. Then, an n-type impurity (e.g., phosphorus) is ion-implanted. After the mask is removed, activation anneal is performed at about 1600° C. for 30 minutes. Thereby, the implanted p-type impurity and n-type impurity are activated, and the contact regions 5, the source regions 6 and 7, and the drain contact region 13 are formed.

Figure 2D:
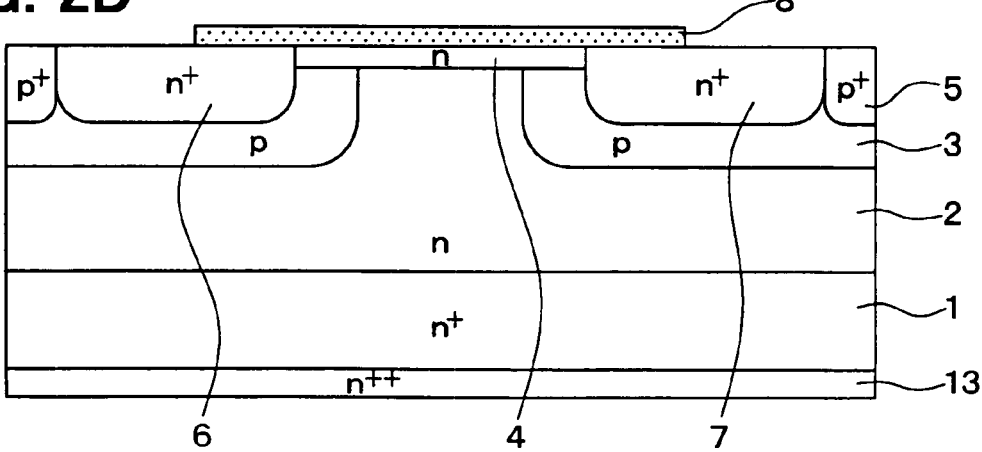

In a process shown in FIG. 2D, the gate oxide layer 8 is formed by a pyrogenic method in a wet atmosphere including both of a hydrogen atom (H) and an oxygen atom (O). In the present process, atmosphere and temperature are controlled as described below, for example.

At first, the temperature is increased from a room temperature to about 1080° C. at about 10° C./min in an inert nitrogen ($N_2$) atmosphere. When the temperature reaches about 1080° C., the atmosphere is changed into the wet ($H_2O$) atmosphere and the temperature is maintained for about 60 minutes. Thereby, the gate oxide layer 8 having a thickness about 52 nm, for example, is formed, as shown in FIG. 2D. Then, the temperature is decreased at about 10° C./min while keeping the wet atmosphere. The wet atmosphere is maintained until the temperature becomes about 700° C. or lower.

In the present process, the wet atmosphere is maintained when the temperature is high. Thereby, at the interface between the gate oxide layer 8 and the channel layer 4, the dangling bond is terminated by the element of H or OH. For example, H or OH enters the gate oxide layer 8.

Figure 3A:
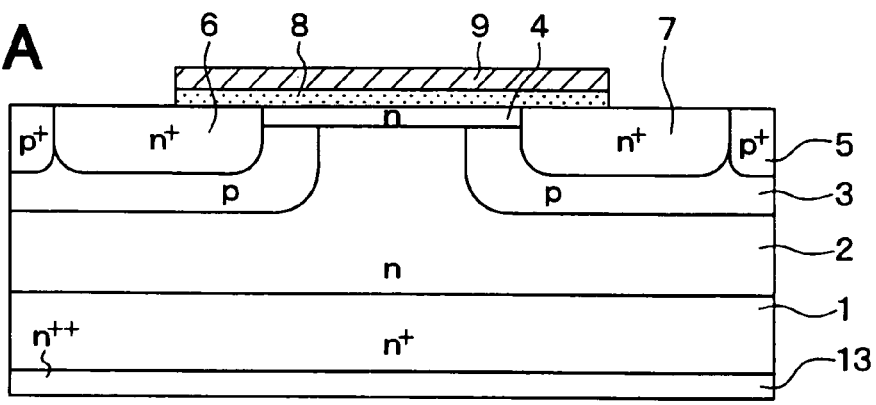
FIGS. 3A-3D are cross-sectional views showing manufacturing processes of the MOSFET, which follow the manufacturing processes shown in FIGS. 2A-2D.

In a process shown in FIG. 3A, a polysilicon layer doped with an n-type impurity is formed on the gate oxide layer 8 at about 600° C., for example. The polysilicon layer has a thickness about 440 nm, for example. Then, the polysilicon layer and the gate oxide layer 8 are patterned by using a mask made of resist, which is formed by photolithography and etching, for example. Thereby, the gate electrode 9 is formed.

Figure 3B:
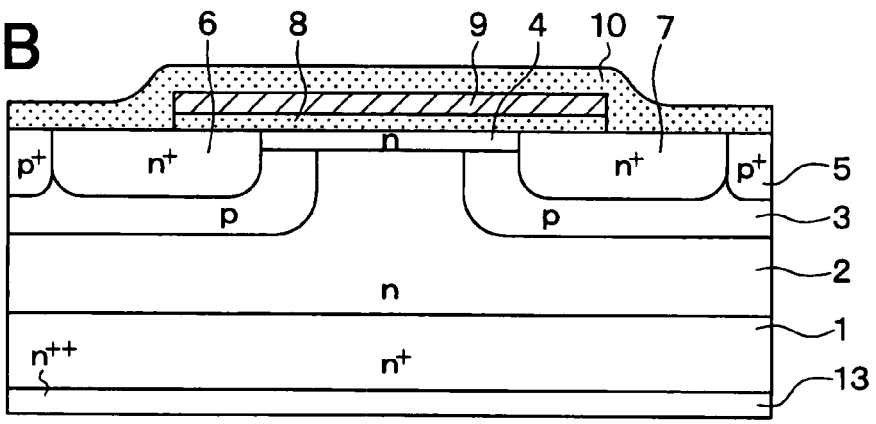
Figure 4:
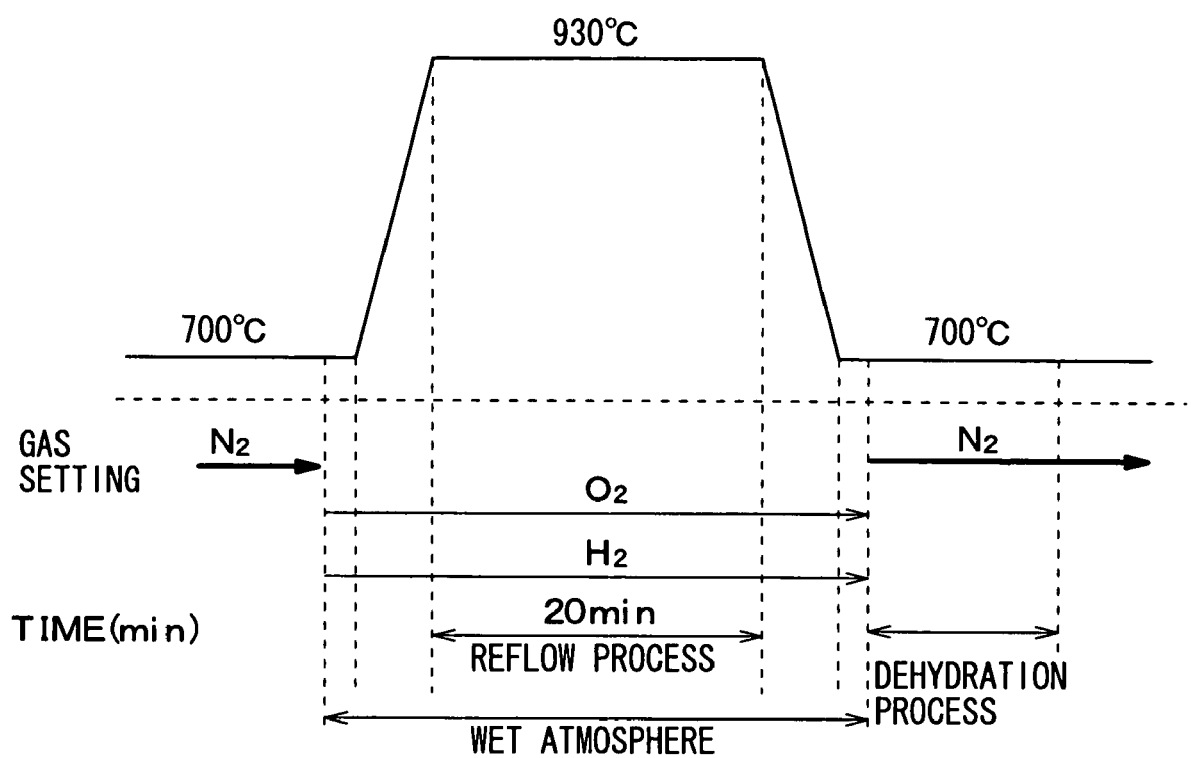
FIG. 4 is a first example of a time chart of an atmosphere and a temperature in a reflow process for forming an interlayer insulation layer.

In a process shown in FIG. 3B, the interlayer insulation layer 10 is formed. For example, a BPSG film having a thickness about 670 nm is formed by plasma CVD at about 420° C. Then, a reflow process is performed at about 930° C. for 20 minutes in the wet atmosphere, thereby the interlayer insulation layer 10 is formed. In the reflow process, temperature and atmosphere are controlled as shown in FIG. 4.

Specifically, the temperature is increased from the room temperature to about 700° C., which is lower than a termination/desorption temperature, in the inert nitrogen ($N_2$) atmosphere. When the temperature reaches about 700° C., the atmosphere is changed into the wet ($H_2O$) atmosphere, and the temperature is increased to about 930° C. at about 10° C./min. After the temperature reaches about 930° C., the reflow process is performed for about 20 minutes while keeping the temperature. After the reflow process, the temperature is decreased to a level lower than about 700° C. taking about 23 minutes at about 10° C./min or less. The wet atmosphere is maintained until the temperature is decreased at about 700° C. After the temperature is decreased at about 700° C., the atmosphere is changed into the $N_2$ atmosphere, and a dehydration process is performed with decreasing the temperature to the room temperature so that the interlayer insulation layer 10 is dehydrated.

When the reflow process is performed at a temperature higher than the termination/desorption temperature, the wet atmosphere is maintained. Thereby, H or OH is restricted from desorbing from the dangling bond at the interface between the gate oxide layer 8 and the channel layer 4. In addition, the edge portion of the gate electrode 9 is rounded and oxidized by the reflow process. Thus, the reflow process of the interlayer insulation layer 10 and the rounding and oxidizing of the edge portion of the gate electrode 9 are performed simultaneously.

Figure 3C:
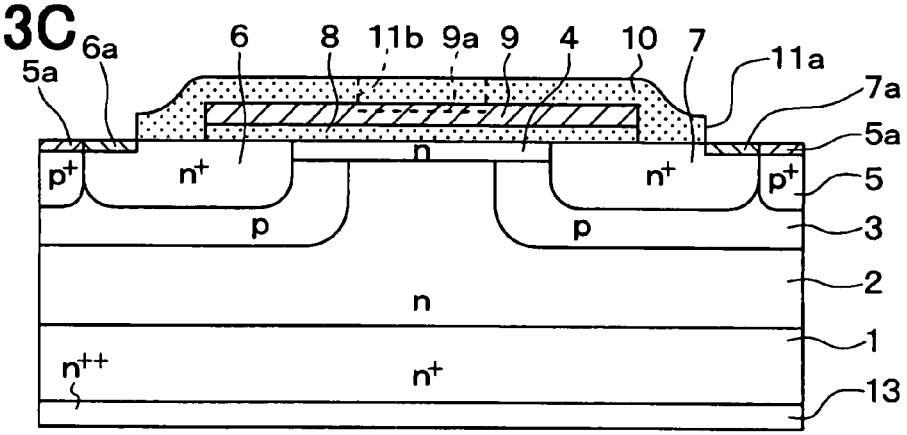

In a process shown in FIG. 3C, the interlayer insulation layer 10 is patterned by using a mask made of resist, which is formed by photolithography and etching, for example. Thereby, the first contact holes 11a reaching the contact regions 5 and the $n^+$-type source regions 6 and 7, and the second contact hole 11b reaching the gate electrode 9 are provided.

Figure 5:
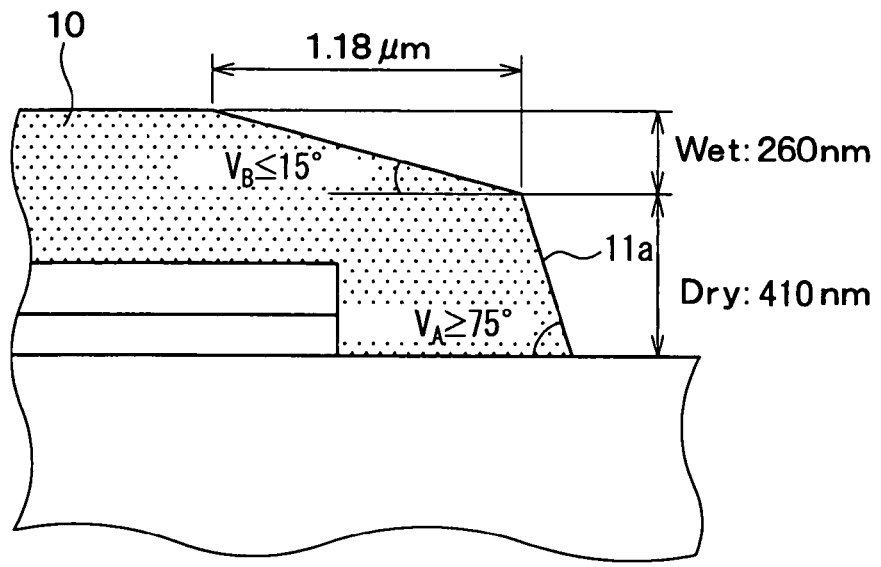
FIG. 5 is an enlarged cross-sectional view of a sidewall of a contact hole provided at the interlayer insulation layer.

In the present process, the contact holes 11a and 11b are provided by wet etching and dry etching in this order, so that a sidewall of each of the contact holes 11a and 11b has an obtuse angle. For example, when the interlayer insulation layer 10 has the thickness about 670 nm, the wet etching is performed for etching about 260 nm, and the dry etching is performed for etching about 410 nm, as shown in FIG. 5. Thereby, the sidewall of each of the contact holes 11a and 11b is formed into two-step regions including a wet-etched region and a dry-etched region.

When the dry-etched region has a first angle $V_A$ between the sidewall and a surface of the substrate (i.e., surfaces of the source regions 6 and 7, or a surface of the gate electrode 9), and the wet-etched region has a second angle $V_B$ between the sidewall and the surface of the substrate, it is preferred that the first angle $V_A$ is larger than the second angle $V_B$. For example, the first angle $V_A$ may be set at 75° or more, and the second angle $V_B$ may be set at 15° or less, as shown in FIG. 5. The first angle $V_A$ becomes large by the dry etching, thereby a minute element can be formed. In addition, an angle between the wet-etched region and the dry-etched region becomes an obtuse angle by wet etching. Thus, edge portions of the contact holes 11a and 11b have similar shapes with a case where the edge portions are rounded.

Figure 6:
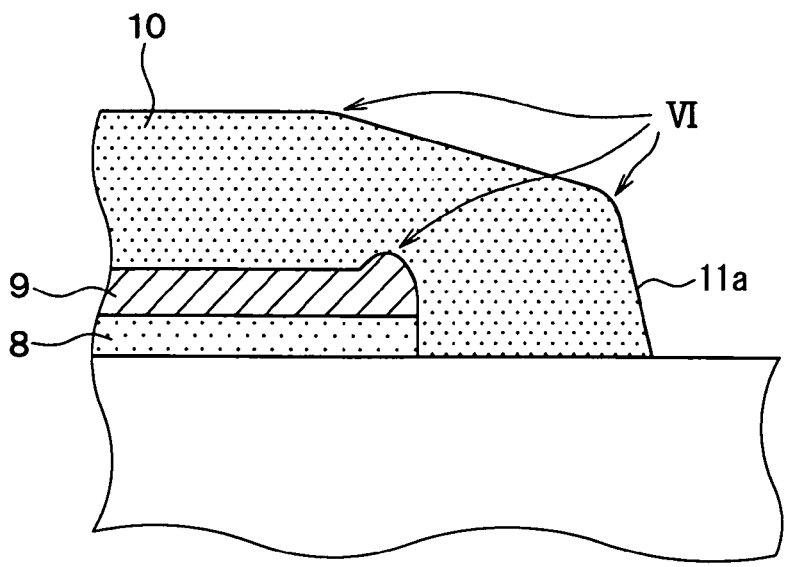
FIG. 6 is an enlarged cross-sectional view of the sidewall of the contact hole after an Ar sputter is performed.

Next, an inert ion, e.g., Ar is sputtered. As shown by arrows VI in FIG. 6, the surface and the edge portions of the interlayer insulation layer 10 are rounded and smoothed by the Ar sputter. Thus, the sidewalls of the contact holes 11a and 11b can be rounded without another reflow process. As a result, the gate electrode 9 is restricted from being oxidized due to a reflow process performed after the contact holes 11a and 11b are provided.

In the process shown in FIG. 3C, a contact metal layer made of Ni or Ti/Ni is formed to fill in the contact holes 11a and 11b, and the contact metal layer is patterned so that the contact parts 5a-7a and 9a are formed. The contact parts 5a-7a and 9a are electrically coupled with the contact regions 5, the $n^+$-type source regions 6 and 7, and the gate electrode 9, respectively. In a process shown in FIG. 3D, the drain electrode 14 made of Ni is formed on a side of the lower surface of the substrate 1 to come in contact with the drain contact region 13. Then, an electrode sintering process is performed in an Ar atmosphere at about 700° C. or lower, thereby the contact parts 5a-7a and 9a and the drain electrode 14 form ohmic contacts. In this case, the contact regions 5, the $n^+$-type source regions 6 and 7, the gate electrode 9, and the drain contact region 13 have the high impurity concentrations, thereby the contact parts 5a-7a and 9a and the drain electrode 14 form the ohmic contacts sufficiently, without a heating process at a high temperature.

Figure 3D:
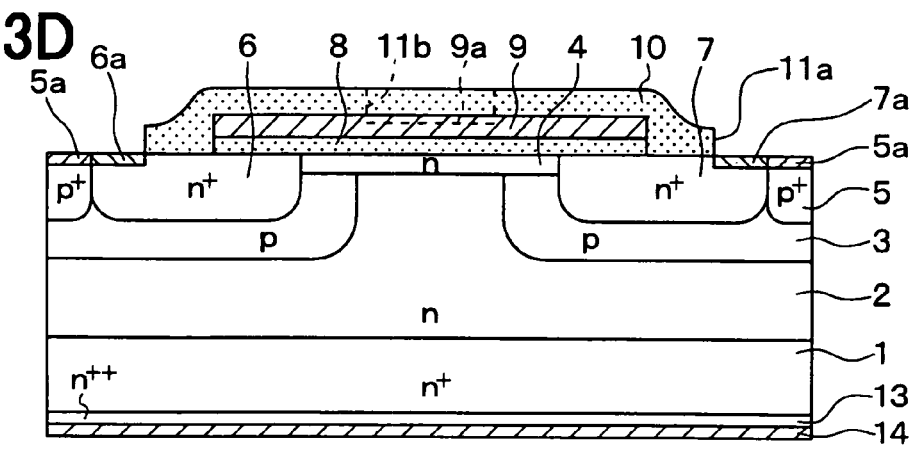

After the process shown in FIG. 3D, the source electrode 12 including the base wire electrode part 12a made of Ti and the wire electrode part 12b made of Al and the gate wire (not shown) are formed, thereby the planer-type MOSFET in FIG. 1 is formed.

In the above-described method of manufacturing the planer-type MOSFET, the temperature is decreased at about 700° C. or lower (e.g., about 600° C.) after the reflow process for forming the interlayer insulation layer 10 is performed, and the dehydration process is then performed in the inert gas atmosphere. Thereby, moisture included in BPSG, which provides the interlayer insulation layer 10, is dehydrated, and a material of the source electrode 12 disposed on the interlayer insulation layer 10 is restricted from being corroded.

Additionally, the edge portions of the gate electrode 9 are rounded and oxidized by the reflow process. Thus, even when the reflow process of the interlayer insulation layer 10 is performed in the wet atmosphere, an oxidized amount of the gate electrode 9 is reduced compared with a case where the rounding and oxidizing of the edge portion of the gate electrode 9 and the reflow process of the interlayer insulation layer 10 are performed separately. Therefore, polysilicon in the gate electrode 9 is restricted from being oxidized in the wet atmosphere. As a result, it can be prevented that the whole polysilicon in the gate electrode 9 is oxidized, thereby the gate electrode 9 can function as a gate electrode and form the ohmic contact.

Furthermore, in the above-described method, after the contact hole 11b reaching the gate electrode 9 is provided at the interlayer insulation layer 10, a heating process in the wet atmosphere is not performed. The edge portions of the sidewalls of the contact holes 11a and 11b are rounded by a combination of the wet etching, the dry etching, and the Ar sputtering. Thus, an exposed portion of the gate electrode 9 is restricted from being oxidized.

Second Embodiment

In the MOSFET in FIG. 1, the contact part 9a, which forms the ohmic contact with the gate electrode 9, is made of the same material as those of the contact parts 5a-7a, which form ohmic contacts with the contact region 5, and the $n^+$-type source regions 6 and 7, respectively. Thus, the first contact hole 11a and the second contact hole 11b are formed in the same process shown in FIG. 3C. Alternatively, the contact part 9a may be made of a different material from those of the contact parts 5a-7a. For example, a contact part 9a made of Ti may form an ohmic contact with the gate electrode 9, and contact parts 5a-7a made of Ni may form ohmic contacts with the contact region 5, and the $n^+$-type source regions 6 and 7, respectively.

In the present case, a MOSFET is formed by the manufacturing processes shown in FIGS. 2A-2D and 3A until the process in which the gate electrode 9 is formed. Then, in a process shown in FIG. 7A, a BPSG layer is formed on the gate oxide layer 8 and the gate electrode 9. The BPSG layer is patterned by using a mask made of resist, which is formed by photolithography and etching, for example. Thereby, the first contact hole 11a, which reaches the contact region 5 and the source regions 6 and 7, is formed. In the present process, the second contact hole 11b, which reaches the gate electrode 9, is not formed.

Then, a reflow process is performed at about 930° C. for 20 minutes, for example. Thereby, the interlayer insulation layer 10 is formed, and the edge portions of the gate electrode 9 and the edge portions of the first contact hole 11a are rounded. In the reflow process, atmosphere and temperature are controlled as shown in FIG. 4, for example.

When the reflow process is performed at a temperature higher than the termination/desorption temperature, the wet atmosphere is maintained. Thereby, H or OH is restricted from desorbing from the dangling bond at the interface between the gate oxide layer 8 and the channel layer 4. In addition, the edge portion of the gate electrode 9 is rounded by the reflow process. Thus, the reflow process of the interlayer insulation layer 10 and the rounding and oxidizing of the edge portion of the gate electrode 9 are performed simultaneously. In the present case, a heating process is performed in a state where a surface of SiC is exposed through the first contact hole 11a. However, the surface of SiC is rarely oxidized at a low temperature about 900° C.

Figure 7A:
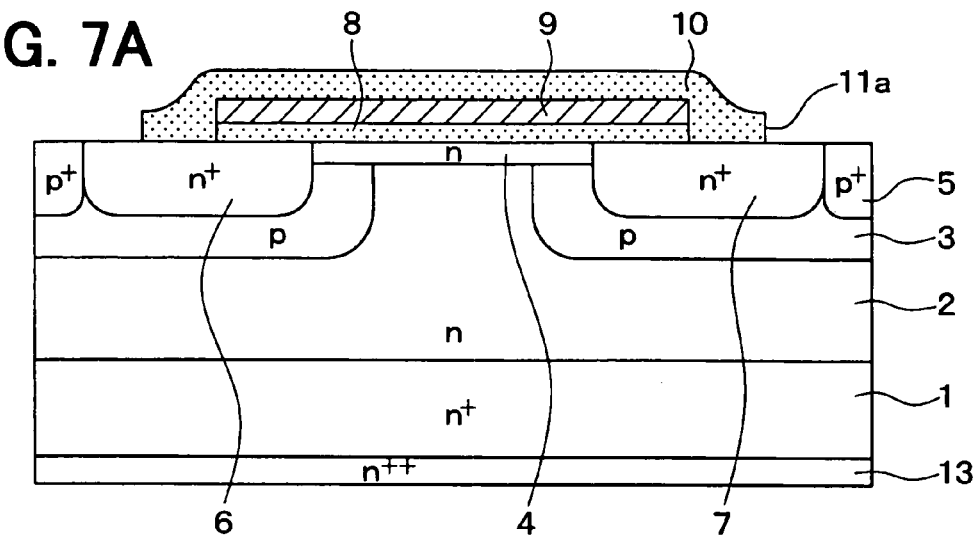
FIGS. 7A-7C are cross-sectional views showing manufacturing processes of a MOSFET according to a second embodiment of the present disclosure.
Figure 7B:
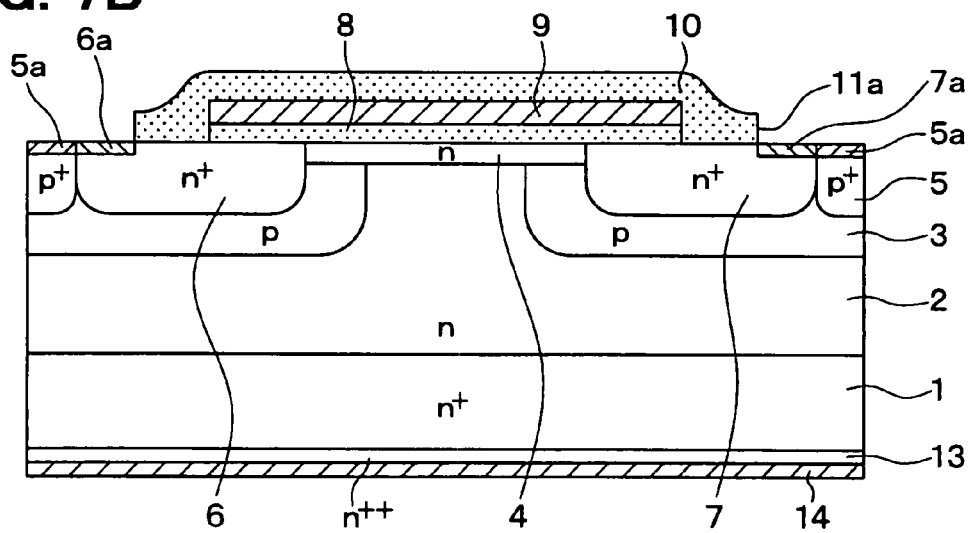

In a process shown in FIG. 7B, a similar process with the process in FIG. 3C is performed. A contact metal layer made of Ni is formed to fill in the first contact hole 11a, and the contact metal layer is patterned. Thereby, the contact parts 5a-7a, which electrically couple with the contact region 5 and the $n^+$-type source regions 6 and 7 respectively, are formed. In addition, the drain electrode 14 made of Ni is formed on the side of the lower surface of the substrate 1 to come in contact with the drain contact region 13. Then, an electrode sintering process is performed in an Ar atmosphere at about 700° C. or lower, thereby the contact parts 5a-7a and the drain electrode 14 form ohmic contacts.

Figure 7C:
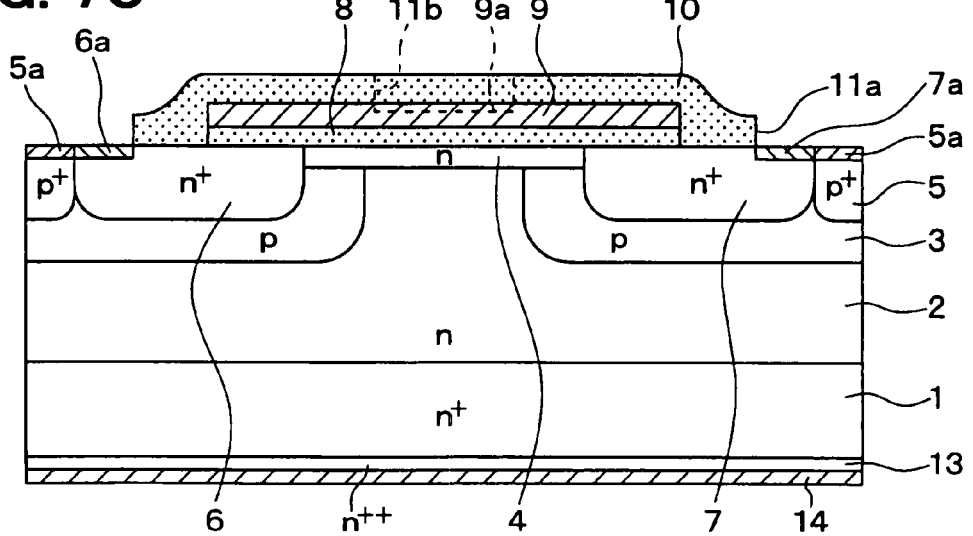

In a process shown in FIG. 7C, the interlayer insulation layer 10 is patterned by using a mask made of a resist, which is formed by a photolithography and an etching, for example. Thereby, the second contact hole 11b reaching the gate electrode 9 is formed.

In the present process, as similarly with the process shown in FIG. 3C, an wet etching and a dry etching are performed in this order, so that the sidewall of the second contact hole 11b have an obtuse angle. An angle between the wet-etched region and the dry-etched region becomes an obtuse angle by the wet etching. Thus, the edge portions of the second contact hole 11b have similar shapes with a case where the edge portions are rounded. In addition, an inert ion, e.g., Ar is sputtered, thereby the surface of the interlayer insulation layer 10 are smoothed and the edge portions of the sidewall of the second contact hole 11b are further rounded. Thus, the interlayer insulation layer 10 have a similar shape with a case where another reflow process is performed.

After the process shown in FIG. 7C, the source electrode 12 including the base wire electrode part 12a made of Ti and the wire electrode part 12b made of Al and the gate wire (not shown) are formed.

Also in the present manufacturing method, the temperature is decreased at about 700° C. or lower (e.g., about 600° C.) after the reflow process for forming the interlayer insulation layer is performed, and the dehydration process is then performed in the inert gas atmosphere. Thus, similar effects with those in the manufacturing method shown in FIGS. 2A-3D are obtained. In addition, when the contact part 9a is made of a different material from those of the contact parts 5a-7a, the first contact hole 11a and the second contact hole 11b may be formed in different processes. Thus, when the second hole 11b reaching the gate electrode 9 is formed after the reflow process, the gate electrode 9 is effectively restricted from being oxidized.

Third Embodiment

Figure 8:
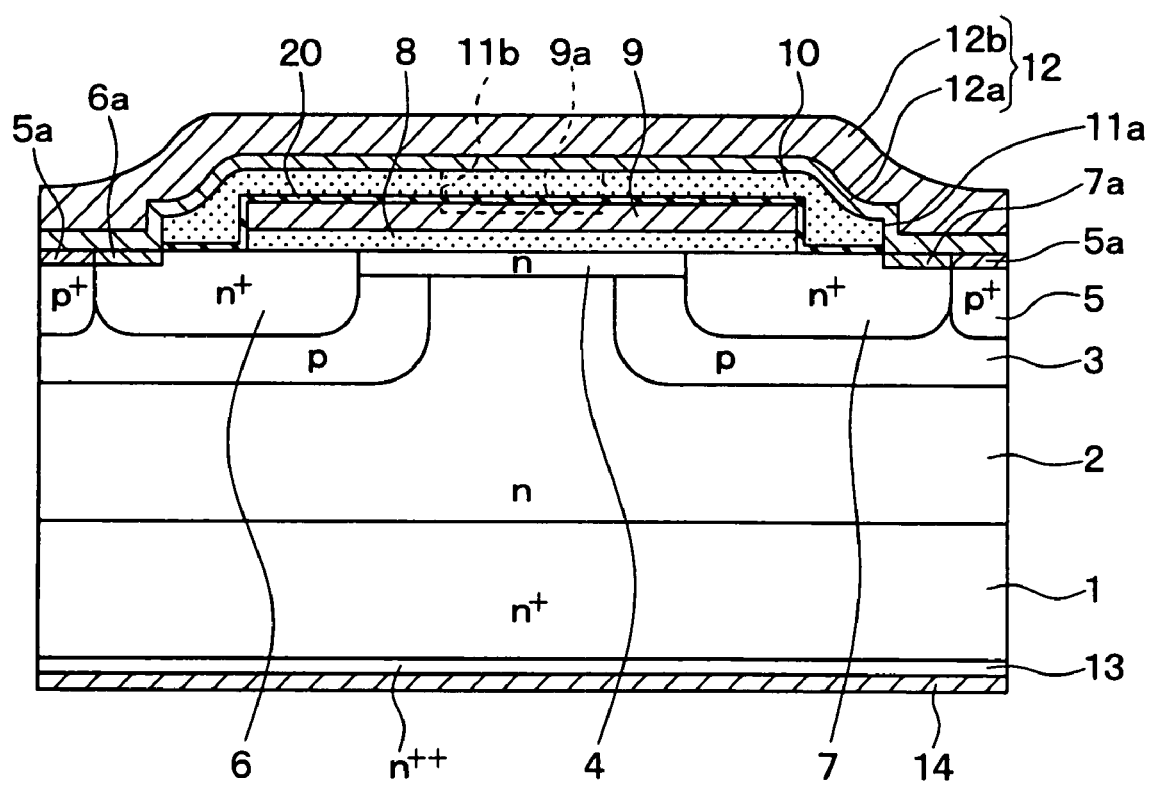
FIG. 8 is a cross-sectional view of a MOSFET according to a third embodiment of the present disclosure.

A MOSFET in FIG. 8 includes a nitride layer 20 for shielding oxygen in the wet atmosphere. The nitride layer 20 is formed on the upper surface of the gate electrode 9 and on the sidewalls of the gate electrode 9 and the gate oxide layer 8, so that the interface between the gate oxide layer 8 and the channel region 4, i.e., a portion in which the dangling bond is terminated by the element of H or OH, is covered by the nitride layer 20. Thereby, the nitride layer 20 prevents oxygen in the wet atmosphere from entering the portion in which the dangling bond is terminated by the element of H or OH.

A manufacturing method of the MOSFET in FIG. 8 will now be described with reference to FIGS. 9A-9D.

At first, the MOSFET is formed by the manufacturing processes shown in FIGS. 2A-2D and 3A until the process in which the gate electrode 9 is formed. After the process shown in FIG. 3A, the edge portion of the gate electrode 9 is rounded and oxidized at about 875° C., for example.

Figure 9A:
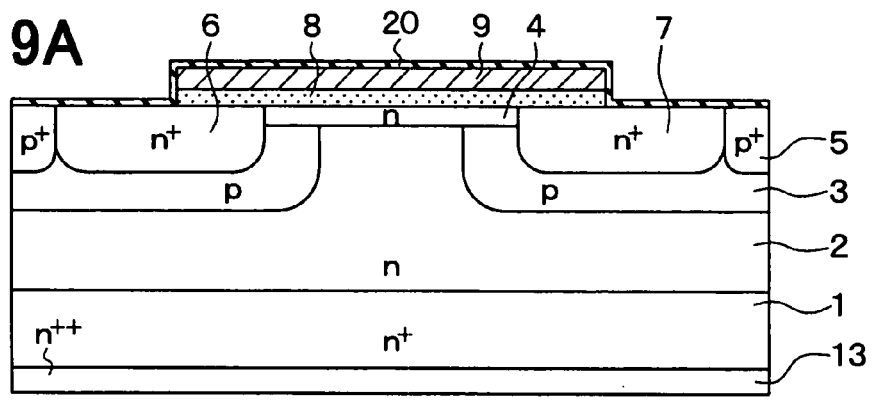
FIGS. 9A-9D are cross-sectional views showing manufacturing processes of the MOSFET according to the third embodiment.
Figure 9B:
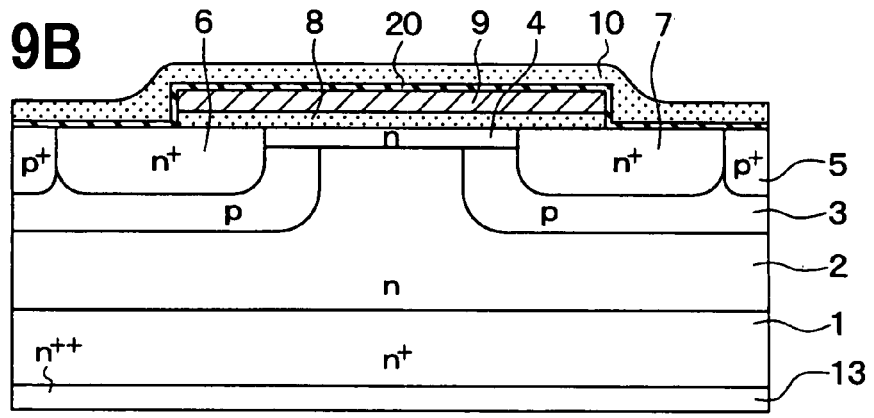
Figure 9C:
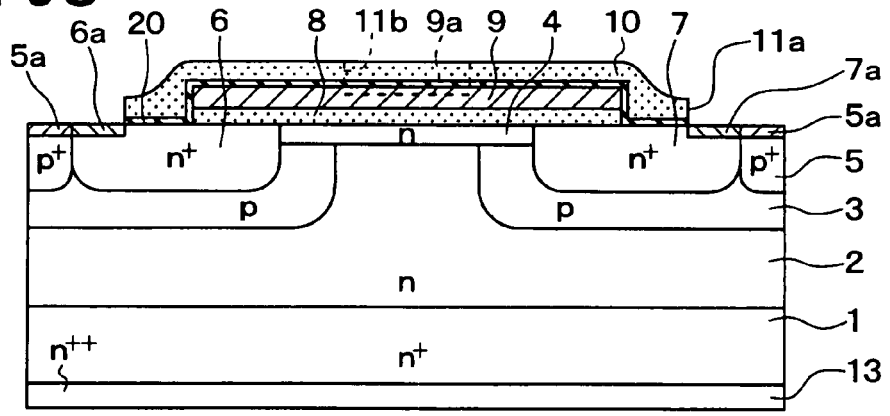
Figure 9D:
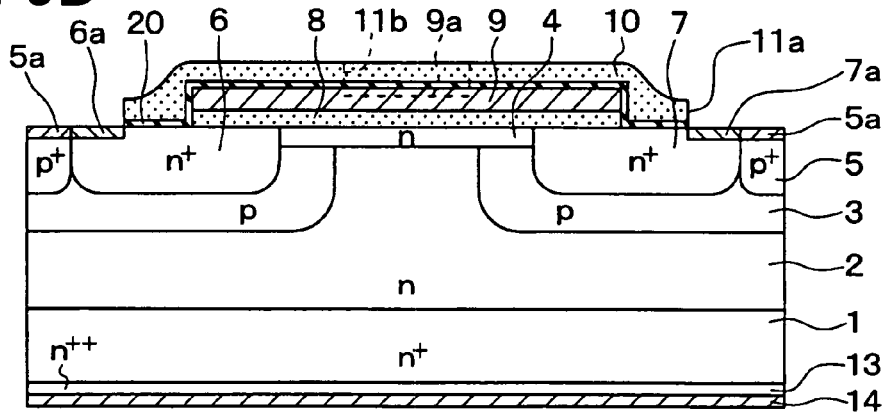

Next, in a process shown in FIG. 9A, the nitride layer 20 is formed on the upper surface of the gate electrode 9 and the sidewalls of the gate electrode 9 and the gate oxide layer 8. The nitride layer 20 has a thickness about 50 nm or more, e.g., about 100 nm. Then, in processes shown in FIGS. 9B-9D, the interlayer insulation layer 10, the contact holes 11a and 11b, the contact parts 5a-7a and 9a, the drain electrode 14, and the gate wire (not shown) are formed.

In the present manufacturing method, the interlayer insulation layer 10 is formed after the nitride layer 20 is formed. Thus, when the wet atmosphere is used in the forming process of the interlayer insulation layer 10, the nitride layer 20 prevents oxygen in the wet atmosphere from entering the portion in which the dangling bond is terminated by the element of H or OH. Therefore, the gate electrode 9 is restricted from being oxidized.

In addition, the MOSFET in FIG. 8 is formed almost similar manufacturing method of those of the MOSFET in FIG. 1, except for the forming process of the nitride layer 20. Thereby, similar effects with those of the MOSFET in FIG. 1 can be obtained.

Fourth Embodiment

When a MOSFET having the nitride layer 20 is formed, the first contact hole 11a and the second contact hole 11b may be formed in different processes, similarly with the processes shown in FIGS. 7A-7C.

Specifically, the MOSFET is formed by the manufacturing processes shown in FIGS. 2A-2D and 3A until the process in which the gate electrode 9 is formed. After the process shown in FIG. 3A, the edge portion of the gate electrode 9 is rounded and oxidized at about 875° C., for example.

Figure 10A:
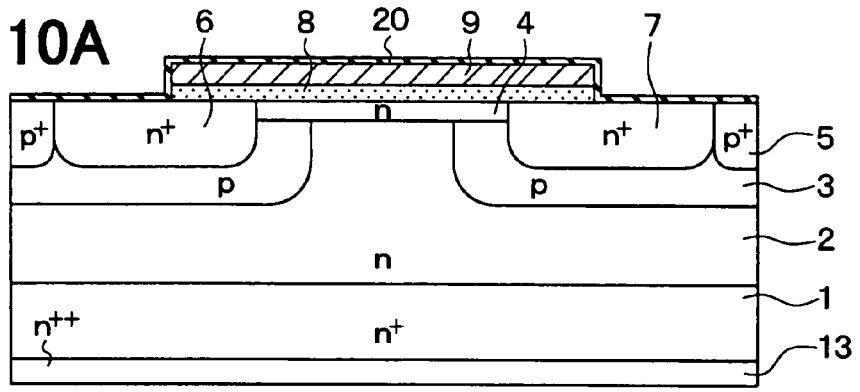
FIGS. 10A-10D are cross-sectional views showing manufacturing processes of a MOSFET according to a fourth embodiment of the present disclosure.
Figure 10B:
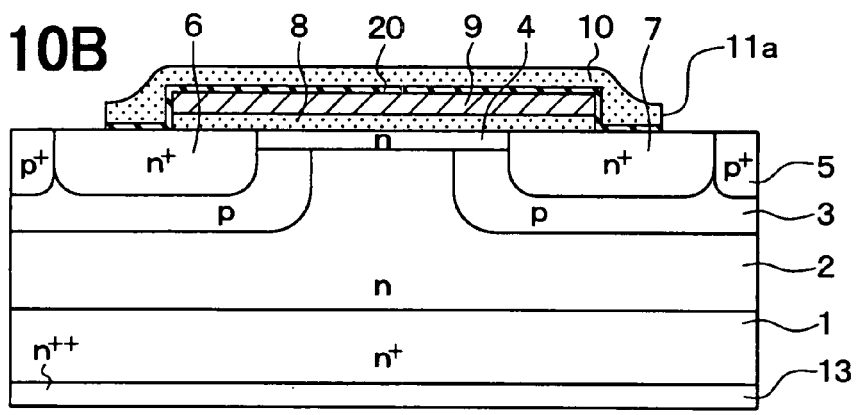
Figure 10C:
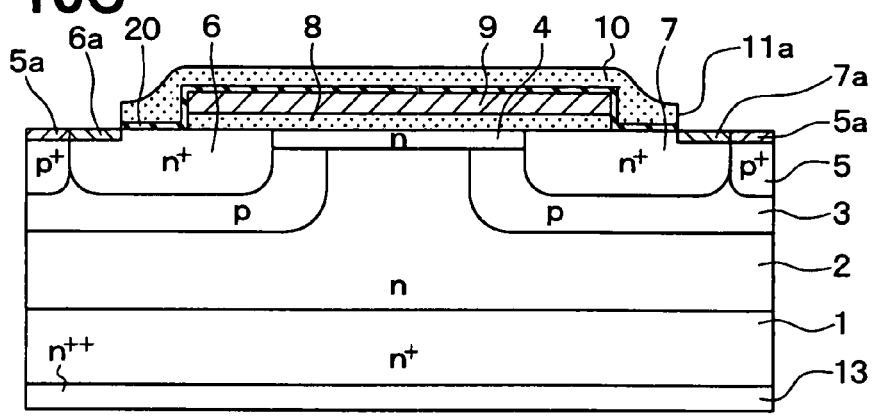
Figure 10D:
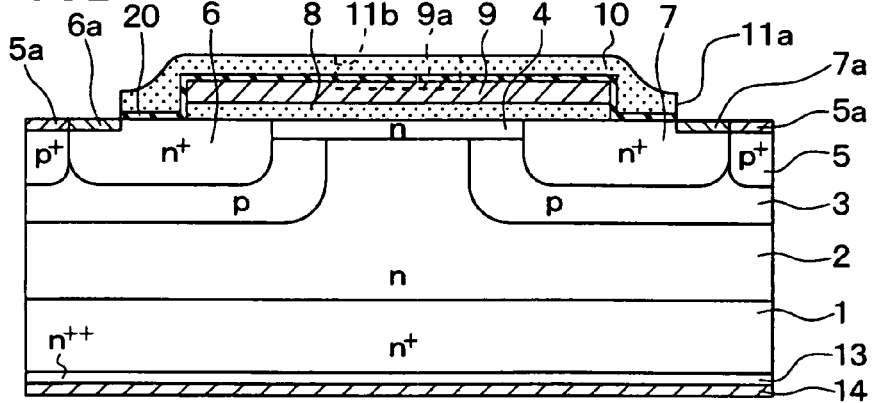

Next, in a process shown in FIG. 10A, the nitride layer 20 is formed on the upper surface of the gate electrode 9 and the sidewalls of the gate electrode 9 and the gate oxide layer 8. The nitride layer 20 has a thickness about 50 nm or more, e.g., about 100 nm. Then, in processes shown in FIGS. 10B-10D, the interlayer insulation layer 10, the first contact hole 11a, the contact parts 5a-7a, the second contact hole 11b, the contact part 9a, the drain electrode 14, and the gate wire (not shown) are formed.

Also in the present case, the interlayer insulation layer 10 is formed after the nitride layer 20 is formed. Thus, when the wet atmosphere is used in the forming process of the interlayer insulation layer 10, the nitride layer 20 prevents oxygen in the wet atmosphere from entering the portion in which the dangling bond is terminated by the element of H or OH. Therefore, the gate electrode 9 is restricted from being oxidized.

In addition, the MOSFET is formed almost similar manufacturing processes shown in FIGS. 7A-7C, except for the forming process of the nitride layer 20. Thereby, similar effects with those of the MOSFET in FIG. 1 can be obtained.

Other Embodiments

In the above-described manufacturing methods, the temperature and the atmosphere in the reflow process and the dehydration process is controlled as shown in FIG. 4. Alternatively, the temperature and the atmosphere may be controlled as shown in FIGS. 11-14, for example.

Figure 11:
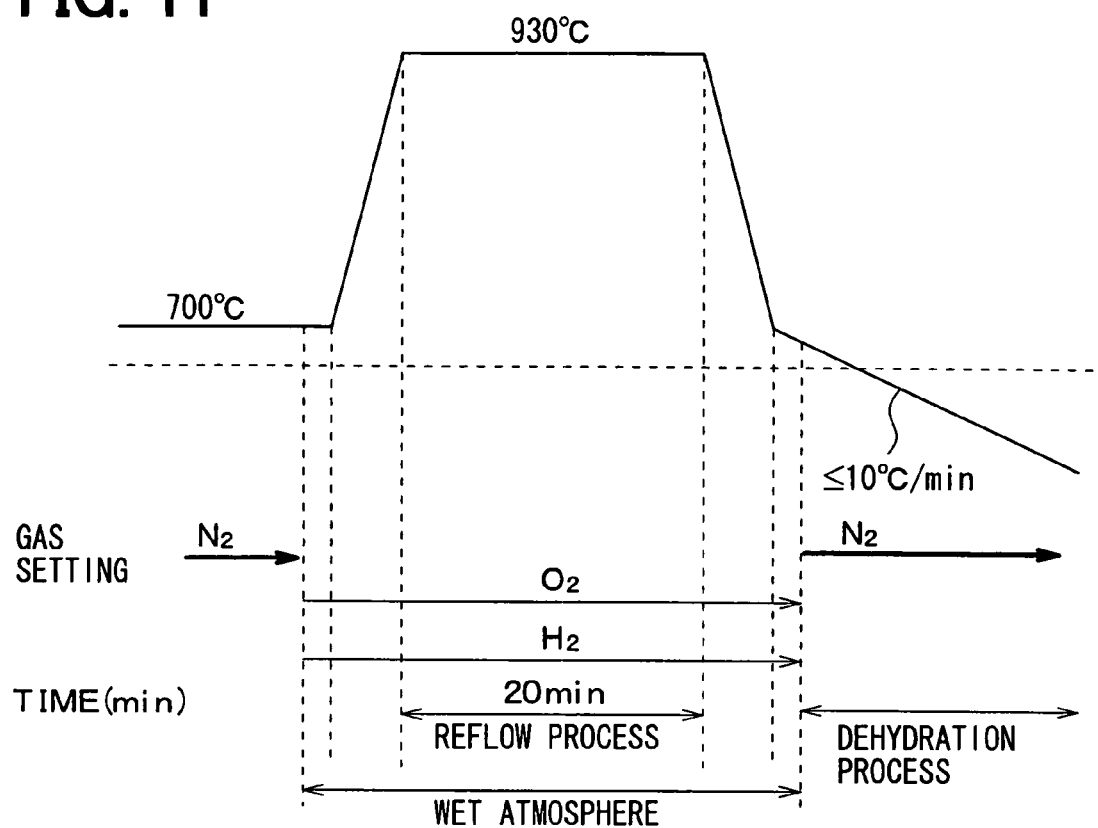
FIG. 11 is a second example of the time chart of the atmosphere and the temperature in the reflow process.
Figure 12:
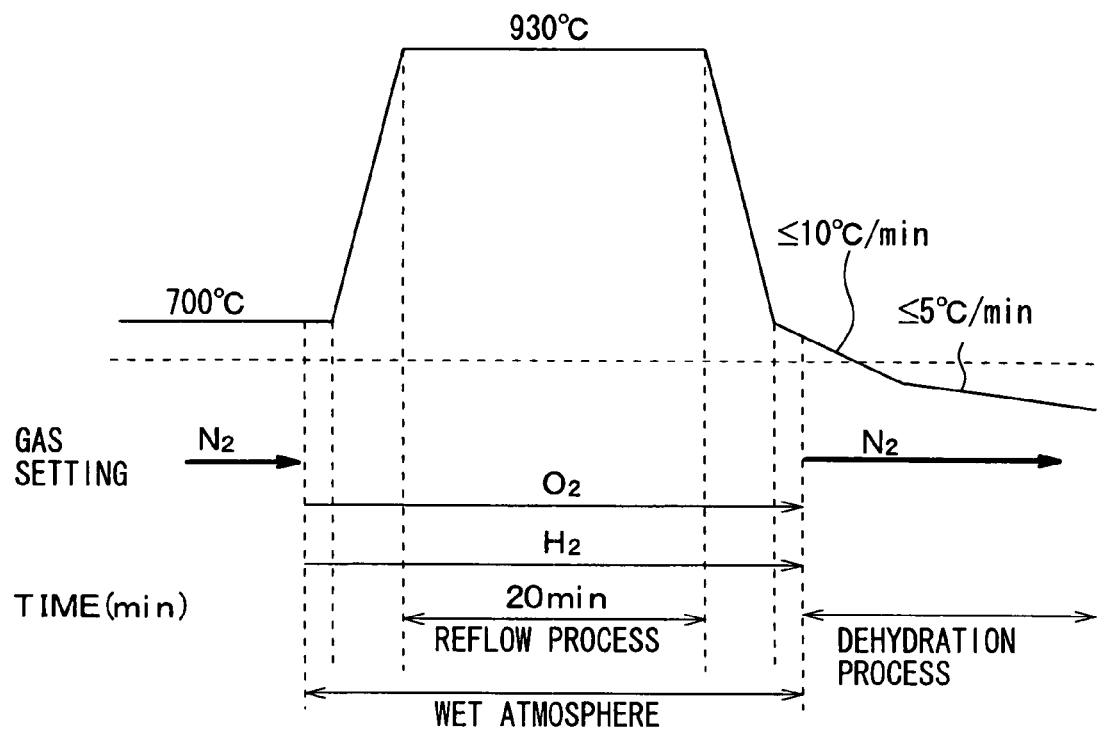
FIG. 12 is a third example of the time chart of the atmosphere and the temperature in the reflow process.
Figure 13:
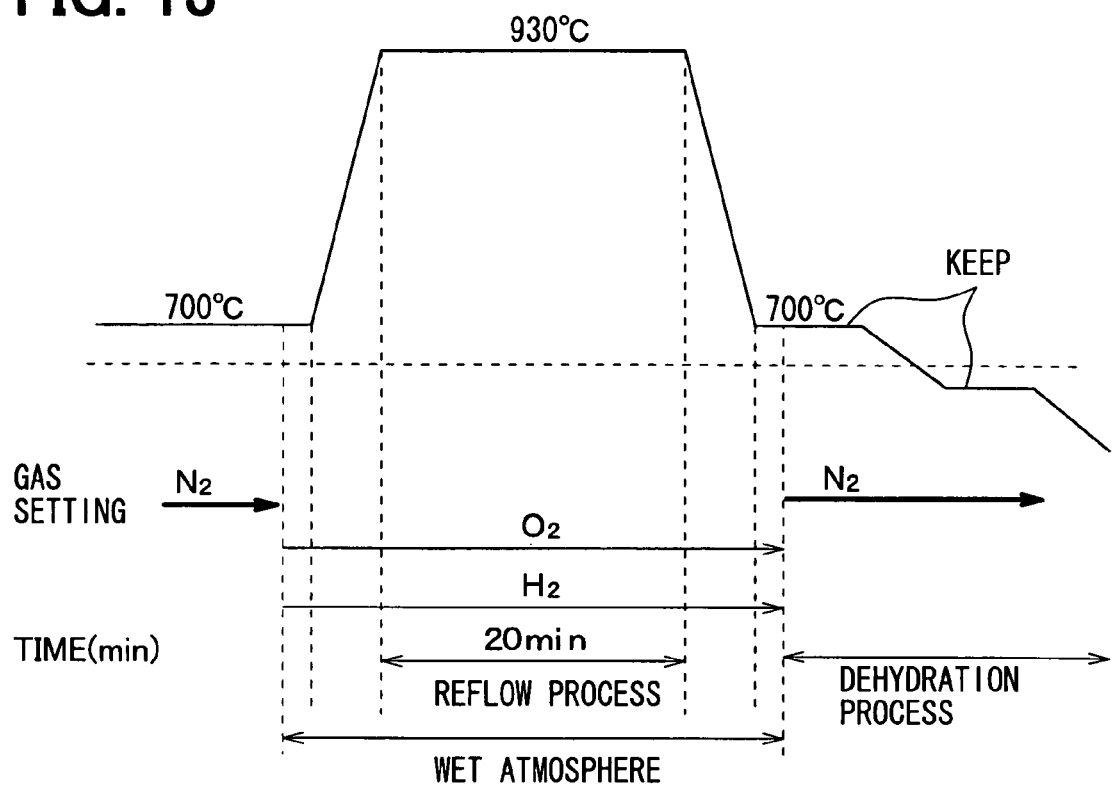
FIG. 13 is a fourth example of the time chart of the atmosphere and the temperature in the reflow process.
Figure 14:
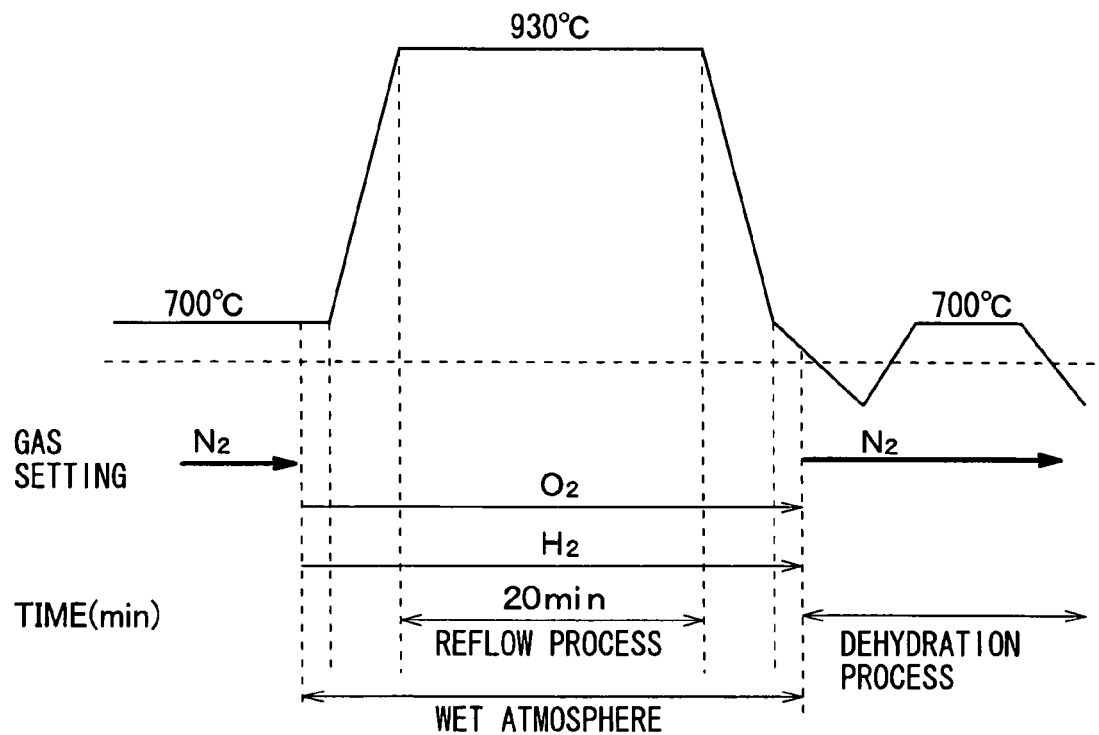
FIG. 14 is a fifth example of the time chart of the atmosphere and the temperature in the reflow process.

As shown in FIG. 11, after the temperature is decreased at about 700° C., the dehydration process may be performed with decreasing the temperature at about 10° C./min or less. Alternatively, as shown in FIG. 12, the dehydration process may include plural steps having different temperature decreasing rates. For example, the dehydration process may have a first step with a temperature decreasing rate at about 10° C./min or less and a second step with a temperature decreasing rate at about 5° C./min or less. As shown in FIG. 13, the dehydration process may include a step of keeping the temperature at a predetermined temperature for a predetermined time. Alternatively, as shown in FIG. 14, the dehydration process may include a decreasing step and an increasing step. At the decreasing step, the temperature is decreased to a first predetermined temperature with a temperature decreasing rate about 10° C./min or less, and at the increasing step, the temperature is increased from the first predetermined temperature to a second predetermined temperature with a temperature increasing rate 10° C./min or less. In the present case, if the temperature is increased at a temperature over about 700° C., it is required to change the inert gas atmosphere to the wet atmosphere or the hydrogen atmosphere again. Thus, it is preferred that the second predetermined temperature is about 700° C. or lower. After the increasing step, the temperature may be kept at the second predetermined temperature for a predetermined time. The temperature may be kept at any point in the dehydration process shown in FIGS. 11-14.

In the above-described manufacturing methods, the inert gas atmosphere includes nitrogen gas. Alternatively, the inert gas atmosphere may include argon gas.

The MOSFET structure in the SiC semiconductor device is not limited to the planer-type MOSFET but may be any MOSFET manufactured by a method including a step of preparing a substrate made of SiC, a step of forming a channel region made of SiC on the substrate, a step of forming a first impurity region and a second impurity region respectively arranged on an upstream side and a downstream side of an electricity flow with respect to the channel region as an electric current passage, a step of forming a gate insulating layer on the channel region, and a step of forming a gate electrode on the gate insulating layer. In the SiC semiconductor device, a channel formed in the channel region and an electric current flowing between the first impurity region and the second impurity region are controlled by controlling a voltage applied to the gate electrode.

For example, in the above-described planer-type MOSFET, the first impurity region includes $n^+$-type source regions 6 and 7, and the second impurity region includes the drain contact region 13. When the impurity concentration of the substrate 1 is high, the drain contact region 13 is not required. In the present case, the substrate 1 becomes the second impurity region 2. Additionally, in the above-described planer-type MOSFET, the gate oxide layer 8 functions as the gate insulation layer. Alternatively, other gate insulation layer having a different structure (e.g., an laminated layer of an oxide layer and a nitride layer) may be used.

When an orientation of a crystal face is described, it is originally required for attaching a bar above a desired figure. However, the bar is attached before the figure in the present application.

Such changes and modifications are to be understood as being within the scope of the present invention as defined by the appended claims.

What is claimed is:

1. A method of manufacturing a silicon carbide semiconductor device having a metal-oxide semiconductor structure, the method comprising:

preparing a substrate made of silicon carbide;

forming a channel region made of silicon carbide on the substrate, wherein the channel region provides an electric current passage;

forming a first impurity region on the substrate on an upstream side of the electric current passage;

forming a second impurity region on the substrate on a downstream side of the electric current passage;

forming a gate insulation layer on a surface of the channel region;

forming a gate electrode on the gate insulation layer to form a semiconductor element;

forming a film on the semiconductor element to provide a material of an interlayer insulation layer;

performing a reflow process at a temperature about 700° C. or over in an wet atmosphere so that the interlayer insulation layer is formed from the film;

decreasing the temperature at about 700° C. or lower after performing the reflow process;

changing the wet atmosphere to an inert gas atmosphere after the temperature is decreased at about 700° C. or lower; and performing a dehydration process in the inert gas atmosphere so that the interlayer insulation layer is dehydrated, wherein:

the channel region provides a channel of the semiconductor element; and the channel is controlled by controlling a voltage applied to the gate electrode so that an electric current flowing between the first impurity region and the second impurity region is controlled.

2. The method according to claim 1, wherein:
the inert gas atmosphere includes nitrogen gas.

3. The method according to claim 1, wherein:
the inert gas atmosphere includes argon gas.

4. The method according to claim 1, wherein:
the decreasing the temperature at about 700° C. or lower is performed with a temperature decreasing rate about 10° C./min or less.

5. The method according to claim 1, wherein:
the dehydration process is performed with decreasing the temperature at about 10° C./min or less.

6. The method according to claim 5, wherein:
the dehydration process is performed with decreasing the temperature at a fixed rate about 10° C./min or less.

7. The method according to claim 5, wherein:
the dehydration process includes a first step and a second step;
the temperature is decreased at a first rate at the first step;
the temperature is decreased at a second rate at the second step; and
the first rate is about 10° C./min or less and the second rate is less than the first rate.

8. The method according to claim 5, wherein:
the dehydration process includes a first step and a second step;
the temperature is decreased to a first predetermined temperature with a temperature decreasing rate about 10° C./min or less at the first step; and
the temperature is increased from the first predetermined temperature to a second predetermined temperature with a temperature increasing rate 10° C./min or less at the second step.

9. The method according to claim 8, wherein:
the second predetermined temperature is about 700° C. or lower.

10. The method according to claim 9, wherein:
the dehydration process further includes a third step; and
the temperature is kept at the second predetermined temperature for a predetermined time at the third step.

11. The method according to claim 7, wherein:
the dehydration process further includes a step of keeping the temperature at a predetermined temperature for a predetermined time.

12. The method according to claim 1, wherein:
the semiconductor element is formed on a face A of the substrate.

* * * * *